(12) United States Patent
Yang

(10) Patent No.: US 11,189,622 B1
(45) Date of Patent: Nov. 30, 2021

(54) SEMICONDUCTOR DEVICE WITH GRAPHENE LAYER AND METHOD FOR FORMING THE SAME

(71) Applicant: NANYA TECHNOLOGY CORPORATION, New Taipei (TW)

(72) Inventor: Cheng-Ling Yang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/934,845

(22) Filed: Jul. 21, 2020

(51) Int. Cl.
*H01L 27/108* (2006.01)
*H01L 29/423* (2006.01)

(52) U.S. Cl.
CPC .. *H01L 27/10823* (2013.01); *H01L 27/10811* (2013.01); *H01L 29/4236* (2013.01); *H01L 27/10876* (2013.01); *H01L 27/10885* (2013.01); *H01L 27/10891* (2013.01)

(58) Field of Classification Search
None
See application file for complete search history.

(56) References Cited

U.S. PATENT DOCUMENTS

| | | | |
|---|---|---|---|
| 6,420,744 B1* | 7/2002 | Kim | H01L 27/11502 257/295 |
| 2002/0017668 A1* | 2/2002 | Hofmann | H01L 27/1203 257/296 |
| 2004/0075379 A1* | 4/2004 | Jin | H01J 3/021 313/495 |
| 2005/0224888 A1* | 10/2005 | Graham | H01L 51/0512 257/368 |
| 2009/0117692 A1* | 5/2009 | Koyama | H01L 21/76254 438/164 |
| 2009/0166686 A1* | 7/2009 | Hunt | B82Y 10/00 257/288 |

\* cited by examiner

*Primary Examiner* — Anthony Ho
*Assistant Examiner* — Kevin Quinto
(74) *Attorney, Agent, or Firm* — Muncy, Geissler, Olds & Lowe, P.C.

(57) ABSTRACT

The present disclosure provides a semiconductor device with a graphene layer and a method for forming the same. The semiconductor device includes a first source/drain region and a second source/drain region disposed in a semiconductor substrate. The semiconductor device also includes a word line structure disposed in the semiconductor substrate and between the first source/drain region and the second source/drain region. The word line structure includes a gate dielectric layer, and a lower electrode layer disposed over the gate dielectric layer. The word line structure also includes an upper electrode layer disposed over the lower electrode layer, and a first graphene layer disposed between the lower electrode layer and the upper electrode layer.

18 Claims, 20 Drawing Sheets

SEMICONDUCTOR DEVICE WITH GRAPHENE LAYER AND METHOD FOR FORMING THE SAME

TECHNICAL FIELD

The present disclosure relates to a semiconductor device and a method for forming the same, and more particularly, to a semiconductor device with a graphene layer and a method for forming the same.

DISCUSSION OF THE BACKGROUND

Semiconductor devices are essential for many modern applications. With the advancement of electronic technology, semiconductor devices are becoming smaller in size while providing greater functionality and including greater amounts of integrated circuitry. Due to the miniaturized scale of semiconductor devices, various types and dimensions of semiconductor devices providing different functionalities are integrated and packaged into a single module. Furthermore, numerous manufacturing operations are implemented for integration of various types of semiconductor devices.

In a semiconductor device, an interconnecting structure is used to electrically connect conductive elements in different layers or in the same layer of an integrated circuit. However, as the semiconductor device scaling-down continues, an interval between adjacent conductive elements is increasingly shrunk, which may decrease the process window of the interconnecting structure. Therefore, it is more and more difficult to manufacture the interconnecting structure in the semiconductor device.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a semiconductor device is provided. The semiconductor device includes a first source/drain region and a second source/drain region disposed in a semiconductor substrate. The semiconductor device also includes a word line structure disposed in the semiconductor substrate and between the first source/drain region and the second source/drain region. The word line structure includes a gate dielectric layer, and a lower electrode layer disposed over the gate dielectric layer. The word line structure also includes an upper electrode layer disposed over the lower electrode layer, and a first graphene layer disposed between the lower electrode layer and the upper electrode layer.

In an embodiment, the gate dielectric layer extends on sidewalls of the lower electrode layer and sidewalls of the upper electrode layer. In an embodiment, the sidewalls of the upper electrode layer are separated from the gate dielectric layer by the first graphene layer. In an embodiment, the lower electrode layer is made of tungsten, titanium nitride, or a combination thereof, and the upper electrode layer is made of polysilicon. In an embodiment, the semiconductor device further includes a dielectric cap layer disposed over the word line structure, wherein the dielectric cap layer is in direct contact with the first graphene layer of the word line structure.

In an embodiment, the semiconductor device further includes a dielectric layer disposed over the semiconductor substrate and the word line structure, and a bit line structure disposed over the dielectric layer and the first source/drain region. In an embodiment, the semiconductor device further includes a lower bit line layer disposed over the dielectric layer, and a second graphene layer disposed over the lower bit line layer. In an embodiment, the bit line structure also includes an upper bit line layer disposed over the second graphene layer, and a third graphene layer disposed over the upper bit line layer.

In another embodiment of the present disclosure, a semiconductor device is provided. The semiconductor device includes a dielectric layer disposed over a semiconductor substrate, and a bit line structure disposed over the dielectric layer. The bit line structure includes a lower bit line layer, and an upper bit line layer disposed over the lower bit line layer. The lower bit line layer and the upper bit line layer are made of different materials. The bit line structure also includes a first graphene layer disposed between the lower bit line layer and the upper bit line layer.

In an embodiment, the lower bit line layer is made of polysilicon, and the upper bit line layer is made of tungsten, titanium nitride, or a combination thereof. In an embodiment, the semiconductor device further includes a dielectric cap layer disposed over the bit line structure. In an embodiment, the bit line structure further includes a second graphene layer disposed between the upper bit line layer and the dielectric cap layer. In an embodiment, the semiconductor device further includes a dielectric spacer disposed on a sidewall of the bit line structure, wherein the dielectric spacer is in direct contact with the first graphene layer.

In an embodiment, the semiconductor device further includes a first source/drain region and a second source/drain region disposed in the semiconductor substrate, wherein the bit line structure overlaps the first source/drain region. In addition, the semiconductor device includes a word line structure disposed in the semiconductor substrate and between the first source/drain region and the second source/drain region, wherein the word line structure includes a third graphene layer. In an embodiment, the word line structure further includes a lower electrode layer, and an upper electrode layer disposed over the lower electrode layer, wherein the lower electrode layer and the upper electrode layer are made of different materials, and the third graphene layer is disposed between the lower electrode layer and the upper electrode layer.

In yet another embodiment of the present disclosure, a semiconductor device is provided. The semiconductor device includes a word line structure disposed in a semiconductor substrate, a first source/drain region and a second source/drain region disposed in the semiconductor substrate and at opposite sides of the word line structure, and a bit line structure disposed over the first source/drain region. The word line structure includes a gate dielectric layer, and a lower electrode layer disposed over the gate dielectric layer. The word line structure also includes an upper electrode layer disposed over the lower electrode layer. The lower electrode layer and the upper electrode layer are made of different materials. The word line structure further includes a first graphene layer disposed between the lower electrode layer and the upper electrode layer and surrounding the upper electrode layer. The bit line structure includes a lower bit line layer, and a second graphene layer disposed over the lower bit line layer. The bit line structure also includes an upper bit line layer disposed over the second graphene layer. The lower bit line layer and the upper bit line layer are made of different materials. The bit line structure further includes a third graphene layer disposed over the upper bit line layer.

In an embodiment, the semiconductor device further includes a first dielectric cap layer disposed in the semiconductor substrate and covering the word line structure, wherein the upper electrode layer of the word line structure is enclosed by the first dielectric cap layer and the first graphene layer. In an embodiment, the semiconductor device further includes a dielectric layer disposed between the bit line structure and the semiconductor substrate, wherein the first source/drain region, the second source/drain region and the first dielectric cap layer are covered by the dielectric layer.

In an embodiment, the semiconductor device further includes a second dielectric cap layer disposed over the bit line structure, wherein the second dielectric cap layer is in direct contact with the third graphene layer. In addition, the semiconductor device includes a dielectric spacer adjoins the lower bit line layer, the second graphene layer, the upper bit line layer, the third graphene layer, and the second dielectric cap layer. In an embodiment, a material of the lower electrode layer of the word line structure is the same as a material of the upper bit line layer of the bit line structure, and a material of the upper electrode layer of the word line structure is the same as a material of the lower bit line layer of the bit line structure.

Embodiments of a semiconductor device are provided in the disclosure. In some embodiments, the semiconductor device includes a graphene layer disposed between a lower electrode layer and an upper electrode layer in a word line structure. In some embodiments, the semiconductor device includes a graphene layer disposed between a lower bit line layer and an upper bit line layer in a bit line structure. The graphene layer is configured to lower the resistance of the word line structure and/or the bit line structure. Therefore, the operation speed of the semiconductor device may be increased, which significantly improves the overall device performance.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
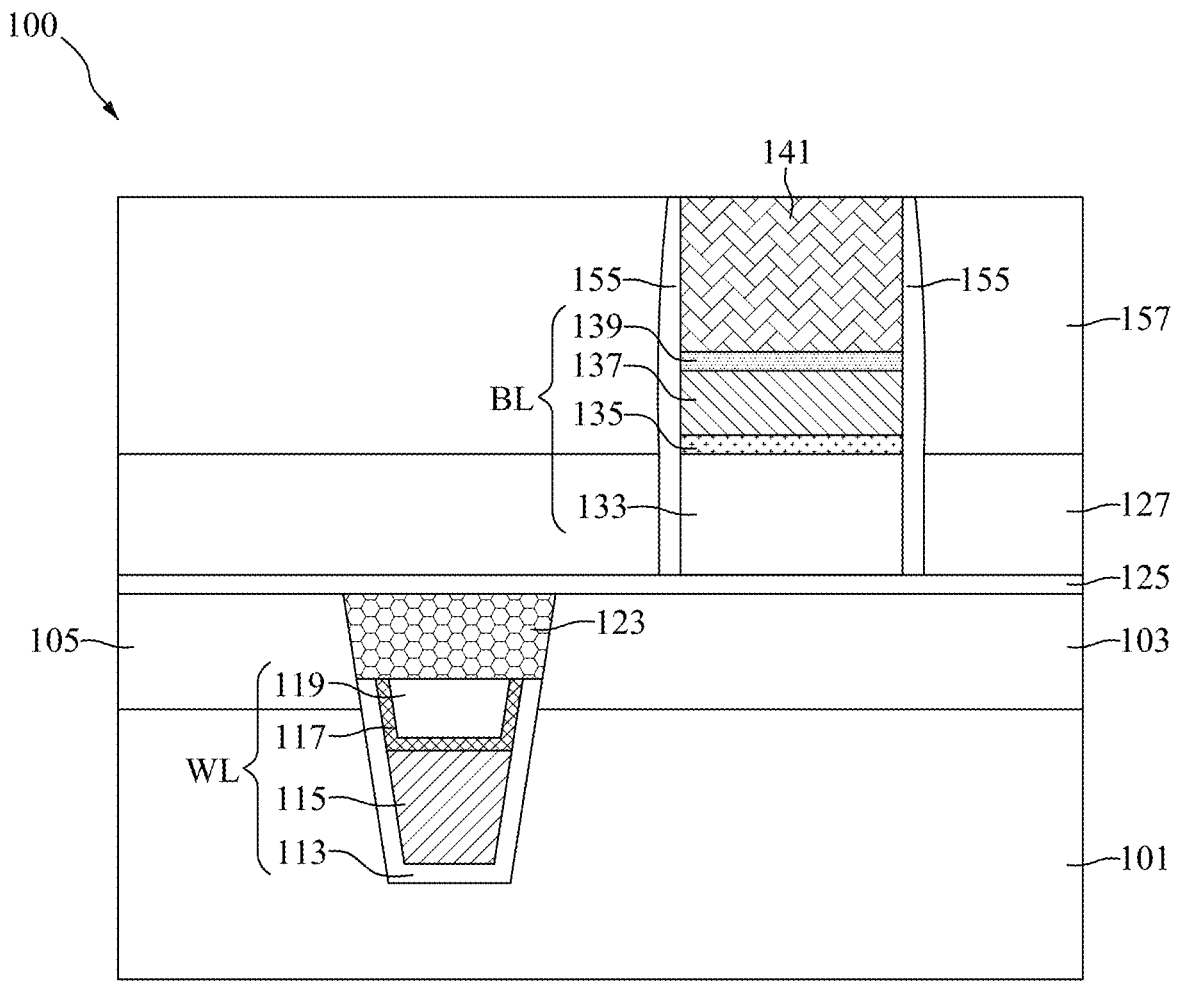
FIG. 1 is a cross-sectional view illustrating a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view illustrating a semiconductor device 100, in accordance with some embodiments. As shown in FIG. 1, the semiconductor device 100 includes source/drain regions 103 and 105 disposed in a semiconductor substrate 101, and a word line structure WL disposed in the semiconductor substrate 101 and between the source/drain regions 103 and 105. The semiconductor device 100 also includes a dielectric layer 125 disposed over the semiconductor substrate 101, and a bit line structure BL disposed over the dielectric layer 125 and overlaps the source/drain region 103.

The word line structure WL includes a gate dielectric layer 113, a lower electrode layer 115, a graphene layer 117 and an upper electrode layer 119. In some embodiments, the gate dielectric layer 113 covers a bottom surface of the lower electrode layer 115 and extends on sidewalls of the lower electrode layer 115 and sidewalls of the upper electrode layer 119. In addition, the graphene layer 117 is disposed between the lower electrode layer 115 and the upper electrode layer 119 and extends on the sidewalls of the upper electrode layer 119. It should be noted that the upper electrode layer 119 is separated from the gate dielectric layer 113 by the graphene layer 117.

Moreover, a dielectric cap layer 123 is disposed over the word line structure WL. In some embodiments, the dielectric cap layer 123 is in direct contact with the gate dielectric layer 113, the graphene layer 117 and the upper electrode layer 119. In some embodiments, the upper electrode layer 119 is enclosed by the dielectric cap layer 123 and the graphene layer 117. As mentioned above, the dielectric layer 125 is disposed over the semiconductor substrate 101, and the dielectric cap layer 123 is covered by the dielectric layer 125, in accordance with some embodiments.

Still referring to FIG. 1, the bit line structure BL disposed over the dielectric layer 125 includes a lower bit line layer 133, a graphene layer 135, an upper bit line layer 137 and another graphene layer 139. In some embodiments, the graphene layer 135 is disposed between the lower bit line layer 133 and the upper bit line layer 137, and the upper bit line layer 139 is disposed between the graphene layers 135 and 139. Moreover, a dielectric cap layer 141 is disposed over the bit line structure BL. In some embodiments, the graphene layer 139 is disposed between the upper bit line layer 137 and the dielectric cap layer 141.

In addition, dielectric spacers 155 are disposed over sidewalls of the bit line structure BL and sidewalls of the dielectric cap layer 141. In some embodiments, the sidewalls of the lower bit line layer 133, the graphene layers 135, 139, the upper bit line layer 137 and the dielectric cap layer 141 are aligned, and the dielectric spacers 155 adjoin the aligned sidewalls of the lower bit line layer 133, the graphene layers 135, 139, the upper bit line layer 137 and the dielectric cap layer 141. Furthermore, a first interlayer dielectric (ILD) layer 127 is disposed over the dielectric layer, and a second ILD layer 157 is disposed over the first ILD layer 127. In some embodiments, the lower portions of the bit line structure BL and the dielectric spacers 155 are surrounded by the first ILD layer 127, and the upper portions of the bit line structure BL and the dielectric spacers 155 are surrounded by the second ILD layer 157.

In the present embodiment, the semiconductor device 100 is a dynamic random access memory (DRAM), and the word line structure WL serves as a buried word line (i.e., gate structure) for the DRAM. Although only one word line structure WL is illustrated, it is understood that more than one word line structure WL may be implemented in the semiconductor device 100. Moreover, the bit line structure BL may serve as a gate structure in a peripheral metal-oxide-semiconductor (MOS) transistor. Although only one bit line structure BL is illustrated, it is understood that more than one bit line structure BL may be implemented in the semiconductor device 100.

Figure 2:
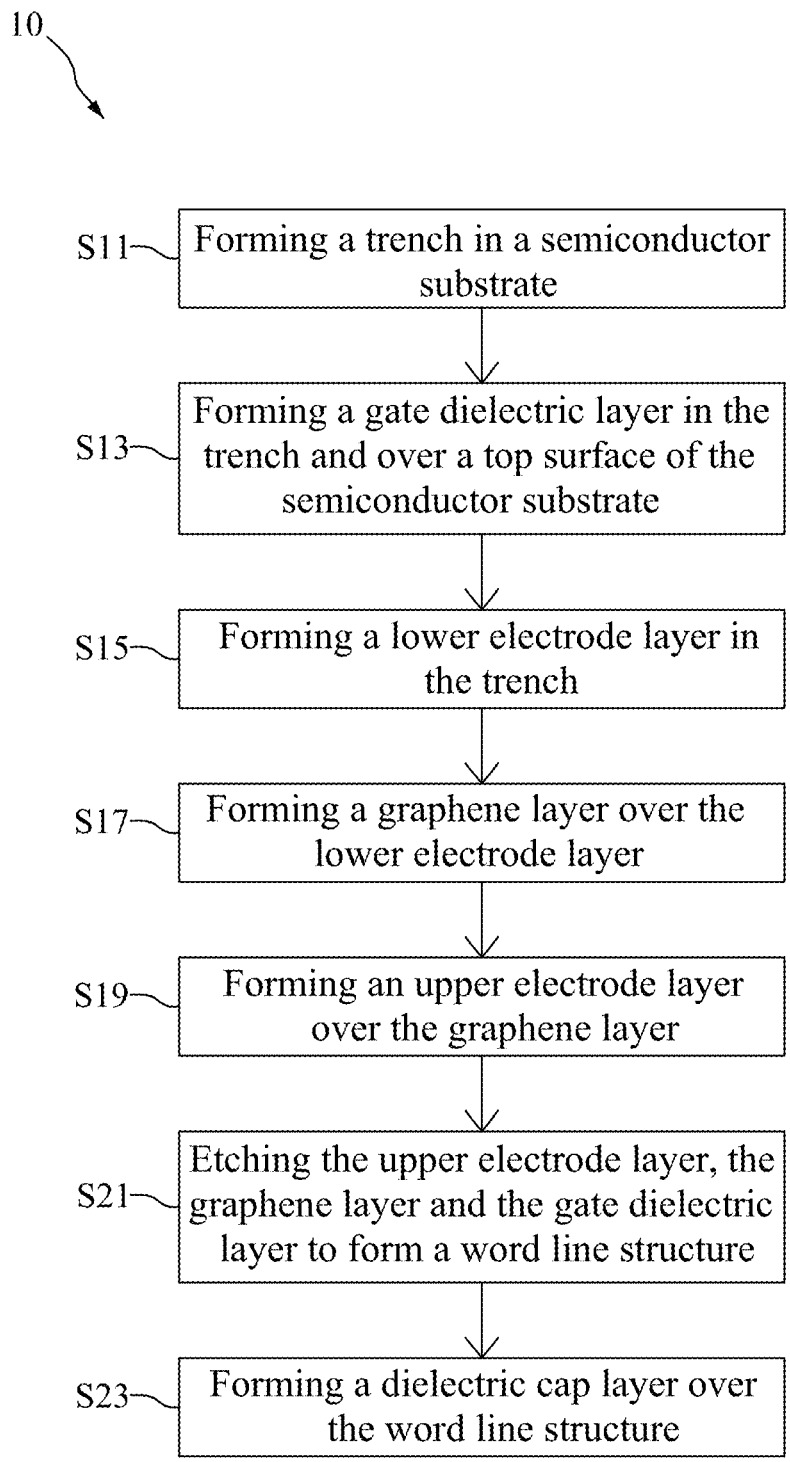
FIG. 2 is a flow diagram illustrating a method of forming a word line structure in a semiconductor device, in accordance with some embodiments.
Figure 3:
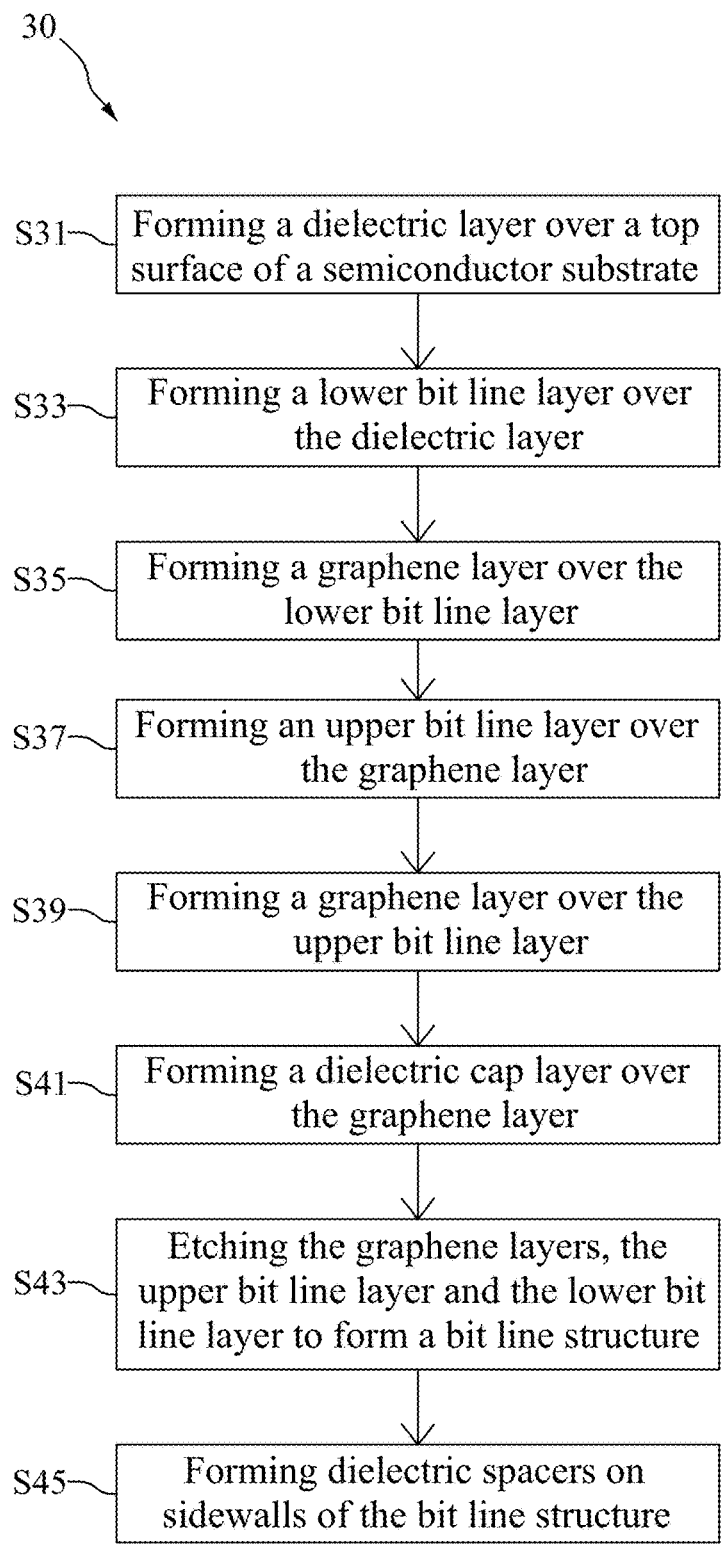
FIG. 3 is a flow diagram illustrating a method of forming a bit line structure in a semiconductor device, in accordance with some embodiments.

FIG. 2 is a flow diagram illustrating a method 10 of forming the word line structure WL in the semiconductor device 100, and the method 10 includes steps S11, S13, S15, S17, S19, S21 and S23, in accordance with some embodiments. FIG. 3 is a flow diagram illustrating a method 30 of forming the bit line structure BL in the semiconductor device 100, and the method 30 includes steps S31, S33, S35, S37, S39, S41, S43 and S45, in accordance with some embodiments. The steps S11 to S23 of FIG. 2 and the steps S31 to S45 are elaborated in connection with the following figures.

Figure 4:
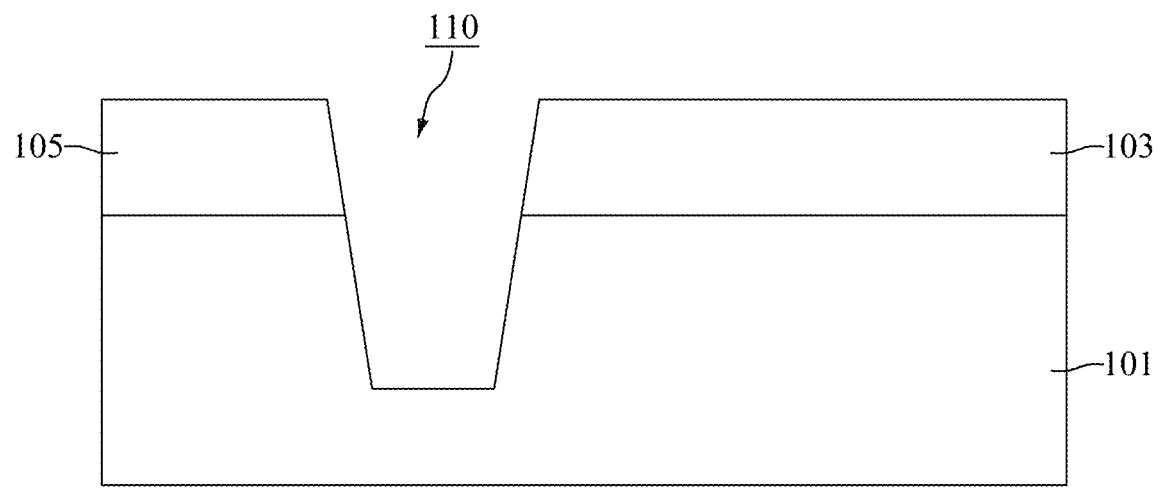
FIG. 4 is a cross-sectional view illustrating an intermediate stage of forming a trench in a semiconductor substrate during the formation of the semiconductor device, in accordance with some embodiments.

FIGS. 4 to 20 are cross-sectional views illustrating intermediate stages of forming the semiconductor device 100, in accordance with some embodiments. As shown in FIG. 4, the semiconductor substrate 101 is provided. The semiconductor substrate 101 may be a semiconductor wafer such as a silicon wafer. Alternatively or additionally, the semiconductor substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the semiconductor substrate 101 includes an epitaxial layer. For example, the semiconductor substrate 101 has an epitaxial layer overlying a bulk semiconductor. In some embodiments, the semiconductor substrate 101 is a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other applicable methods.

Still referring to FIG. 4, the source/drain regions 103 and 105 are formed in the semiconductor substrate 101, and a trench 110 is formed in the semiconductor substrate 101 and between the source/drain regions 103 and 105. The respective step is illustrated as the step S11 in the method 10 shown in FIG. 2. In some embodiments, the source/drain regions 103 and 105 are formed by one or more ion implantation processes, and P-type dopants, such as boron (B), gallium (Ga), or indium (In), or N-type dopants, such as phosphorous (P) or arsenic (As), can be implanted in the semiconductor substrate 101 to form the source/drain regions 103 and 105, depending on the conductivity type of the semiconductor device 100.

The formation of the trench 110 may include forming a patterned mask (not shown) over the semiconductor substrate 101, and etching the semiconductor substrate 101 by using the patterned mask as a mask. The etching process may include a wet etching process, a dry etching process, or a combination thereof. After the trench 110 is formed, the pattered mask may be removed.

Figure 5:
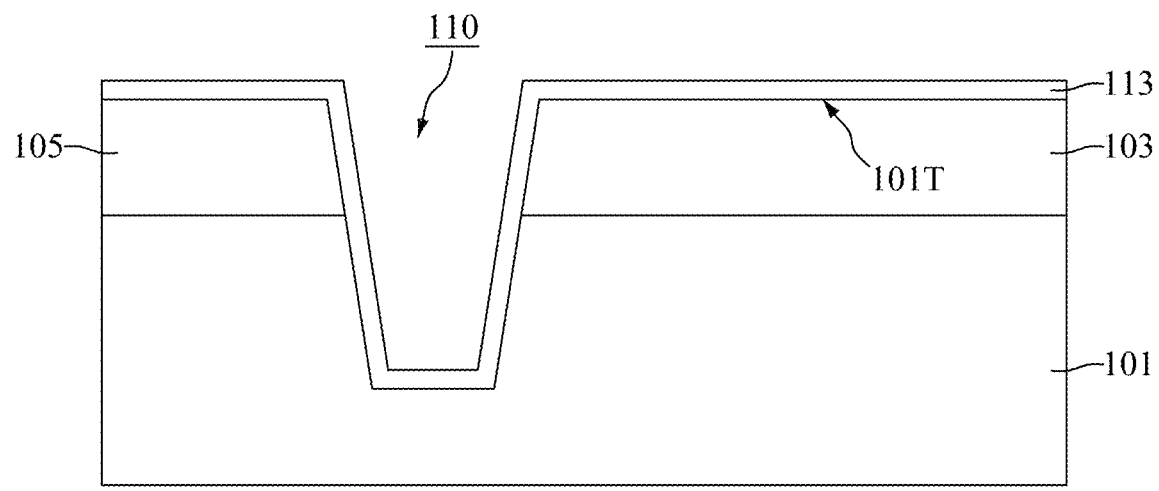
FIG. 5 is a cross-sectional view illustrating an intermediate stage of forming a gate dielectric layer during the formation of the semiconductor device, in accordance with some embodiments.

Next, the gate dielectric layer 113 is formed lining the inner surfaces of the trench 110 and extending over the top surface 101T of the semiconductor substrate 101, as shown in FIG. 5 in accordance with some embodiments. The respective step is illustrated as the step S13 in the method 10 shown in FIG. 2. In some embodiments, the gate dielectric layer 113 is made of silicon oxide, silicon nitride, silicon oxynitride, a dielectric material with high dielectric constant (high-k), or a combination thereof. The deposition process of the gate dielectric layer 113 may include a chemical vapor deposition (CVD) process, a physical vapor deposition (PVD) process, an atomic layer deposition (ALD) process, a spin-on coating process, or another applicable process.

Figure 6:
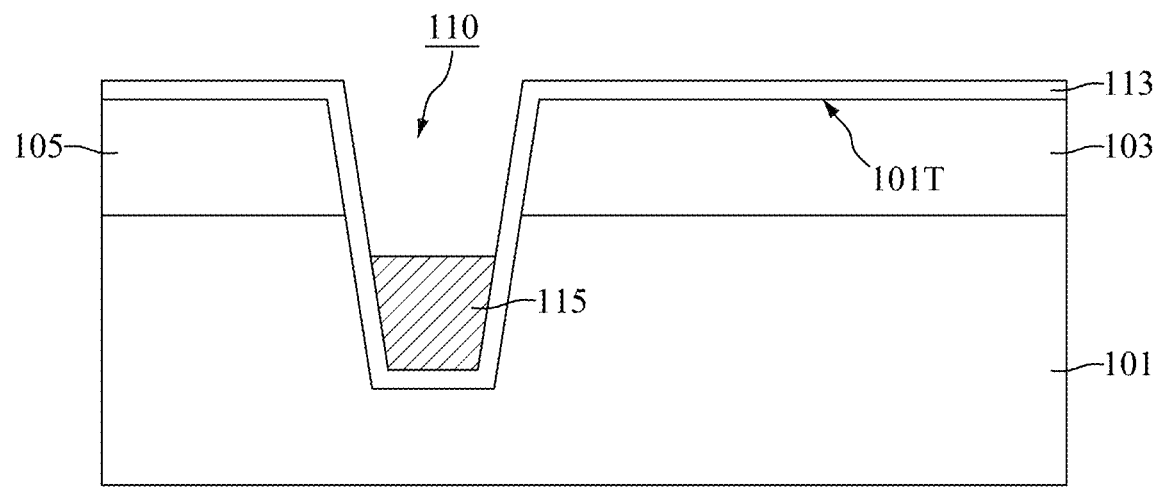
FIG. 6 is a cross-sectional view illustrating an intermediate stage of forming a lower electrode layer in the trench during the formation of the semiconductor device, in accordance with some embodiments.

After the gate dielectric layer 113 is formed, the lower electrode layer 115 is formed in the lower portion of the trench 110, as shown in FIG. 6 in accordance with some embodiments. The respective step is illustrated as the step S15 in the method 10 shown in FIG. 2. In some embodiments, the gate electrode layer 115 is made of a conductive material, such as tungsten (W), aluminum (Al), copper (Cu), titanium (Ti), tantalum (Ta), or another applicable conductive material. In some embodiments, the gate electrode layer 115 may further include a barrier layer (not shown) formed over the gate dielectric layer 113. In some embodiments, the barrier layer may include Ti, TiN, Ta, TaN, or another applicable barrier layer material.

Moreover, the gate electrode layer 115 may be formed by one or more deposition processes. The deposition processes may include a CVD process, a PVD process, an ALD process, a plasma enhanced chemical vapor deposition (PECVD) process, a metal organic chemical vapor deposition (MOCVD) process, a plating process, a sputtering process or another applicable process. After the deposition processes, an etch-back process may be performed such that the top surface of the lower electrode layer 115 is lower than the top surface 101T of the semiconductor substrate 101. In some embodiments, the etch-back process includes a wet etching process, a dry etching process, or a combination thereof.

Figure 7:
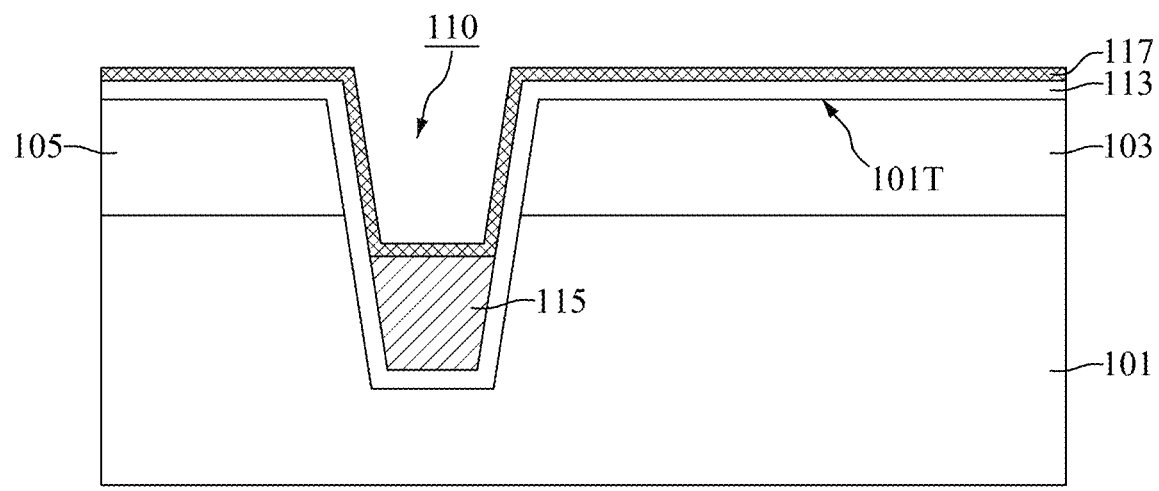
FIG. 7 is a cross-sectional view illustrating an intermediate stage of forming a graphene layer over the lower electrode layer during the formation of the semiconductor device, in accordance with some embodiments.

Subsequently, the graphene layer 117 is formed over the lower electrode layer 115 and the gate dielectric layer 113, as shown in FIG. 7 in accordance with some embodiments. The respective step is illustrated as the step S17 in the method 10 shown in FIG. 2. In some embodiments, the trench 110 is not completely filled with the graphene layer 117.

In some embodiments, the graphene layer 117 is formed by a CVD process. More specifically, the gas used in the CVD process for forming the graphene layer 117 includes a main gas and a carrier gas. In some embodiments, the main gas includes $C_xH_y$, such as methane CH4, and the carrier gas includes He, Ar, or a combination thereof. In some embodiments, the CVD process for forming the graphene layer 117 is performed at a temperature from about 25° C. to about 425° C. After the CVD process, an annealing process may be performed on the graphene layer 117 to stabilize the structure. Since graphene is a low-resistance conductive material, resistive-capacitive (RC) delay of signals transmitted through the conductive layers can be reduced.

Figure 8:
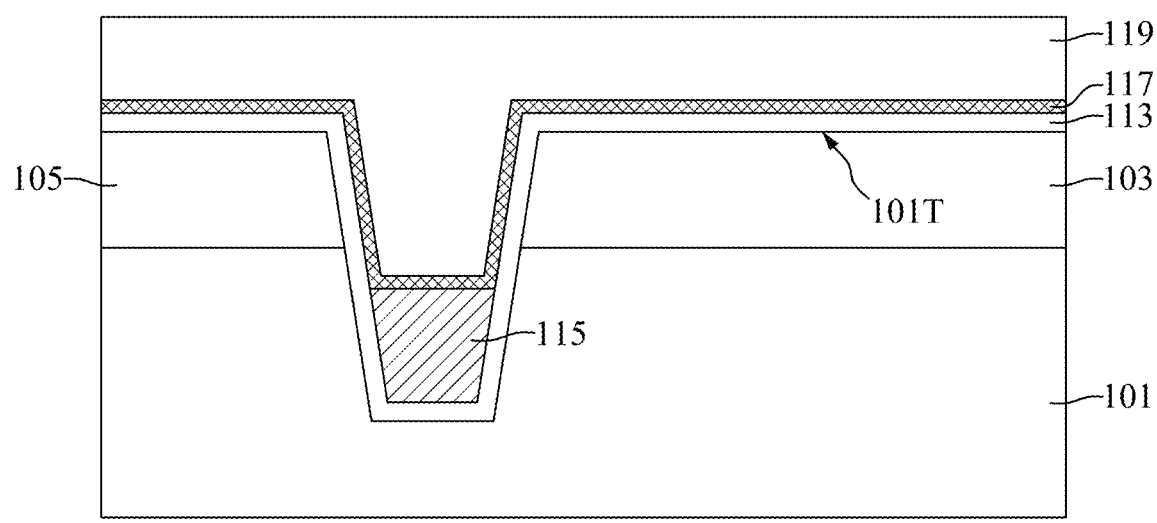
FIG. 8 is a cross-sectional view illustrating an intermediate stage of forming an upper electrode layer over the graphene layer during the formation of the semiconductor device, in accordance with some embodiments.

Then, the upper electrode layer 119 is formed over the graphene layer 117, as shown in FIG. 8 in accordance with some embodiments. The respective step is illustrated as the step S19 in the method 10 shown in FIG. 2. In some embodiments, the remaining portion (i.e., the upper portion) of the trench 110 is filled with the upper electrode layer 119. In some embodiments, the upper electrode layer 119 is made of polysilicon. Moreover, the upper electrode layer 119 may be formed by a CVD process, a PVD process, an ALD process, a spin-on coating process or another applicable process.

Figure 9:
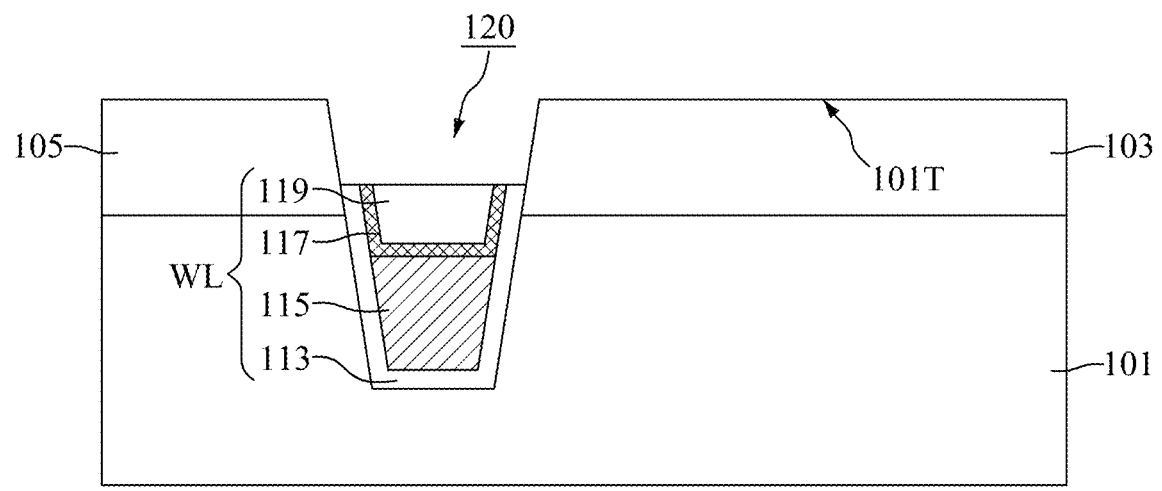
FIG. 9 is a cross-sectional view illustrating an intermediate stage of etching the upper electrode layer, the graphene layer and the gate dielectric layer to form a word line structure during the formation of the semiconductor device, in accordance with some embodiments.

Next, the gate dielectric layer 113, the graphene layer 117 and the upper electrode layer 119 are etched to expose the top surface 101T of the semiconductor substrate 101, as shown in FIG. 9 in accordance with some embodiments. The respective step is illustrated as the step S21 in the method 10 shown in FIG. 2. In some embodiments, an etch-back process is performed on the gate dielectric layer 113, the graphene layer 117 and the upper electrode layer 119, such that the top surfaces of the gate dielectric layer 113, the graphene layer 117 and the upper electrode layer 119 are lower than the top surface 101T of the semiconductor substrate 101. In some embodiments, the etch-back process includes a wet etching process, a dry etching process, or a combination thereof. After the etch-back process is performed, the word line structure WL is obtained, and a recess 120 is formed over the word line structure WL.

Figure 10:
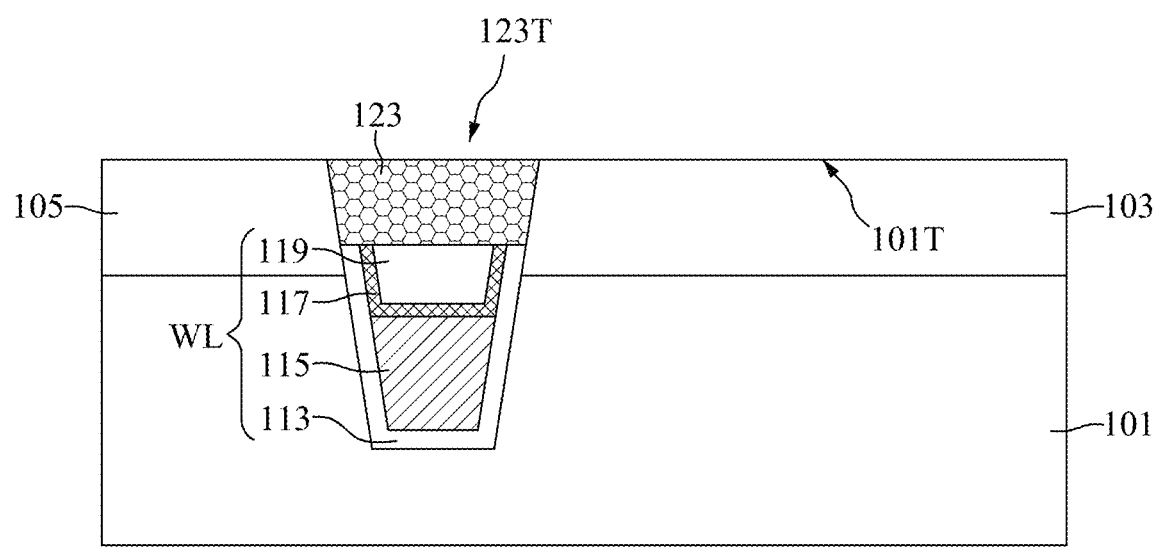
FIG. 10 is a cross-sectional view illustrating an intermediate stage of forming a dielectric cap layer over the word line structure during the formation of the semiconductor device, in accordance with some embodiments.

After the word line structure WL is formed, the dielectric cap layer 123 is formed in the recess 120 to cover the word line structure WL, as shown in FIG. 10 in accordance with some embodiments. The respective step is illustrated as the step S23 in the method 10 shown in FIG. 2. In some embodiments, the dielectric cap layer 123 is made of a dielectric material such as silicon nitride, although any other dielectric materials may alternatively be utilized.

Moreover, the dielectric cap layer 123 may be formed by a deposition process, such as a CVD process, a PVD process, an ALD process, a spin-on coating process or another applicable process. After the deposition process, a planarization process may be performed to remove the excess portions of the dielectric material outside of the recess 120, such that the top surface 123T of the dielectric cap layer 123 is coplanar with the top surface 101T of the semiconductor substrate 101. In some embodiments, the planarization process is a chemical mechanical polishing (CMP) process.

Figure 11:
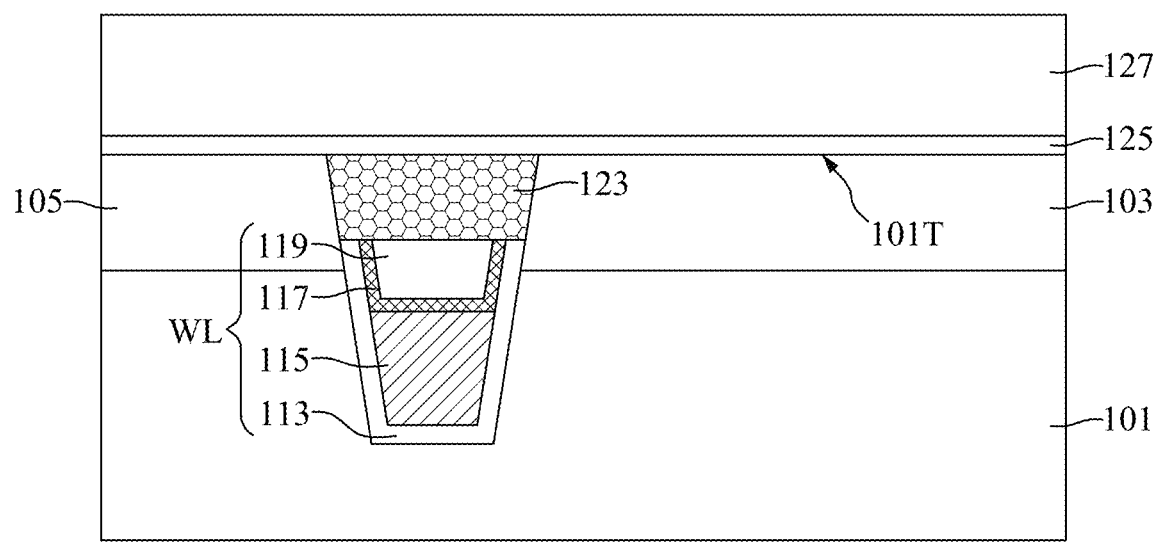
FIG. 11 is a cross-sectional view illustrating an intermediate stage of forming a dielectric layer over the semiconductor substrate and a first interlayer dielectric layer over the dielectric layer during the formation of the semiconductor device, in accordance with some embodiments.

After the dielectric cap layer 123 is formed, the dielectric layer 125 is formed over the top surface 101T of the semiconductor substrate 101, as shown in FIG. 11 in accordance with some embodiments. The respective step is illustrated as the step S31 in the method 30 shown in FIG. 3. Moreover, the first ILD layer 127 is formed over the dielectric layer 123. In some embodiments, the dielectric layer 125 is made of silicon oxide, silicon nitride, silicon oxynitride, a dielectric material with high dielectric constant (high-k), or a combination thereof. The dielectric layer 125 may be formed by a CVD process, a PVD process, an ALD process, a spin-on coating process, or another applicable process.

Moreover, the first ILD layer 127 may include multilayers made of multiple dielectric materials, such as silicon oxide, silicon nitride, silicon oxynitride, tetraethoxysilane (TEOS) oxide, phosphosilicate glass (PSG), borophosphosilicate glass (BPSG), low-k dielectric material, and/or other applicable dielectric materials. The first ILD layer 127 may be formed by a CVD process, a PVD process, an ALD process, a spin-on coating process, or another applicable process. In some embodiments, the material of the dielectric layer 125 is different from the material of the first ILD layer 127.

Figure 12:
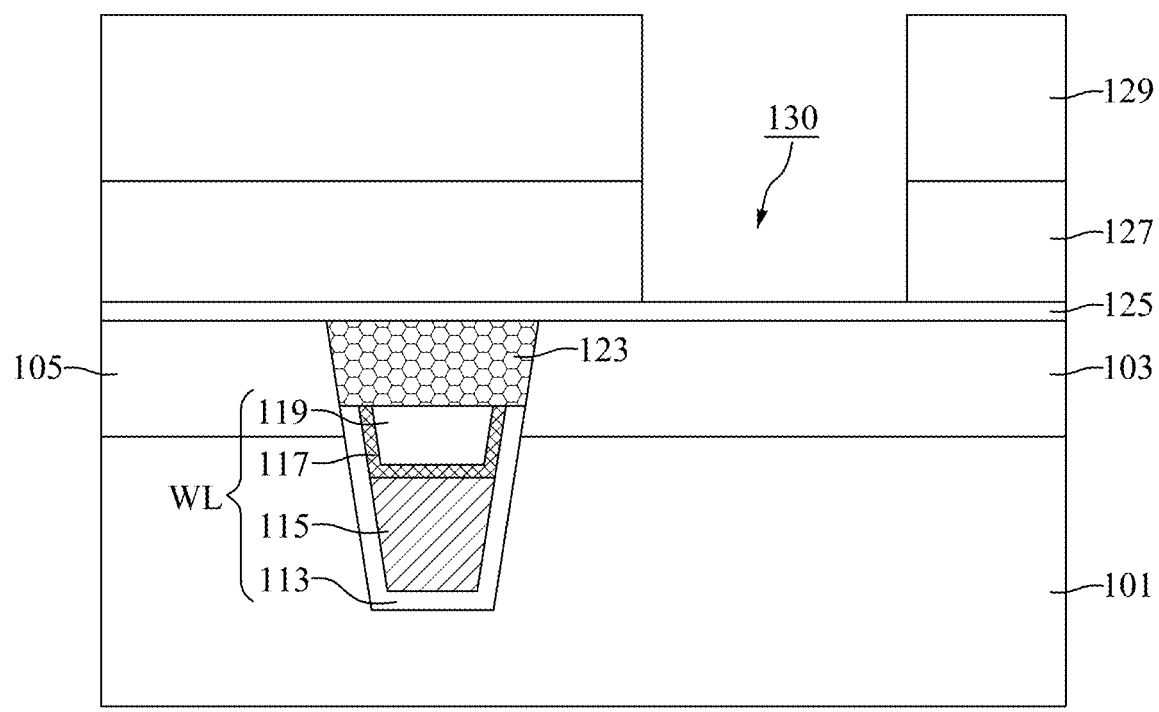
FIG. 12 is a cross-sectional view illustrating an intermediate stage of etching the dielectric layer and the first interlayer dielectric layer to form an opening during the formation of the semiconductor device, in accordance with some embodiments.

Then, a patterned mask 129 is formed over the first ILD layer 127, and the first ILD layer 127 is etched by using the patterned mask 129 as a mask, as shown in FIG. 12 in accordance with some embodiments. As described previously, the material of the dielectric layer 125 is different from the material of the first ILD layer 127, and the materials are selected such that the etching selectivity of the first ILD layer 127 with respect to the dielectric layer 125 is high. Therefore, the first ILD layer 127 is etched while the dielectric layer 125 may be substantially left, and an opening 130 in the first ILD layer 127 is obtained. It should be noted that the opening 130 is directly over the source/drain region 103, in accordance with some embodiments.

Figure 13:
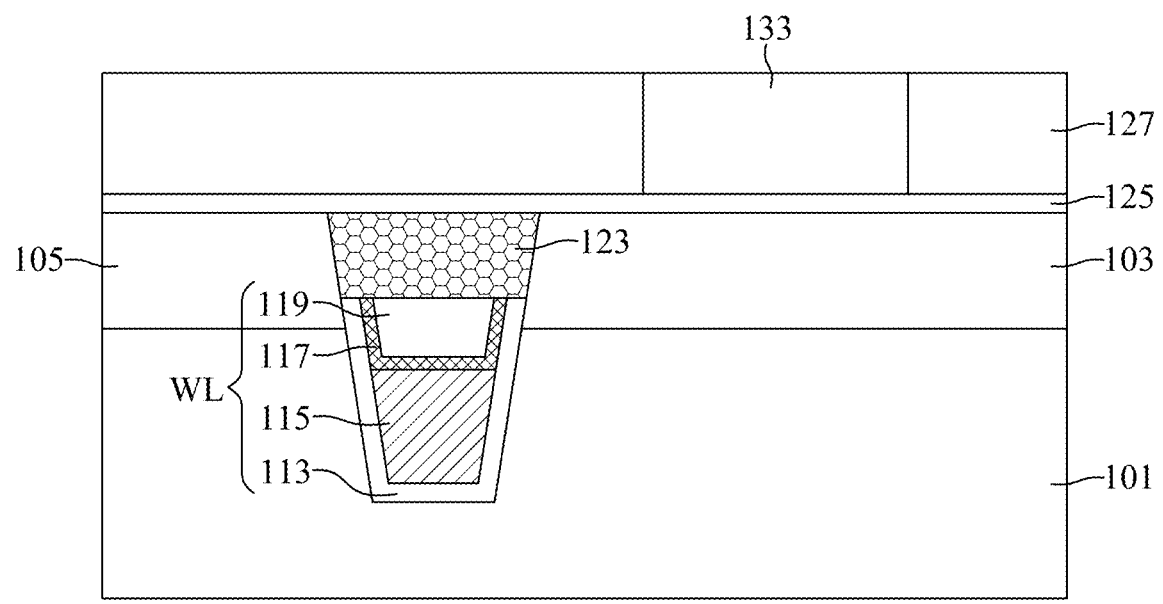
FIG. 13 is a cross-sectional view illustrating an intermediate stage of forming a lower bit line layer in the opening during the formation of the semiconductor device, in accordance with some embodiments.

Next, the lower bit line layer 133 is formed in the opening 130 and over the dielectric layer 125, as shown in FIG. 13 in accordance with some embodiments. The respective step is illustrated as the step S33 in the method 30 shown in FIG. 3. In some embodiments, the lower bit line layer 133 is made of polysilicon, and the lower bit line layer 133 overlaps the source/drain region 103.

The lower bit line layer 133 may be formed by a deposition process, such as a CVD process, a PVD process, an ALD process, a spin-on coating process or another applicable process. After the deposition process, a planarization process may be performed to remove the excess portions of the material of the lower bit line layer 133 outside of the opening 130. In addition, the patterned mask 129 may be removed during the planarization process. In some embodiments, the planarization process is a CMP process.

Figure 14:
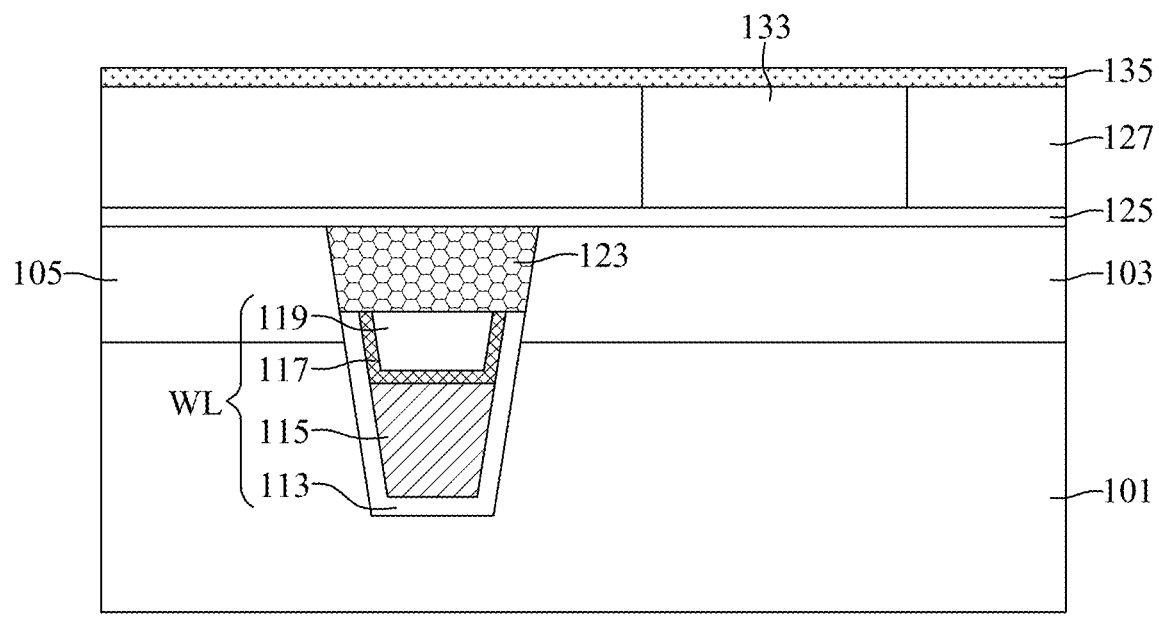
FIG. 14 is a cross-sectional view illustrating an intermediate stage of forming a graphene layer over the lower bit line layer during the formation of the semiconductor device, in accordance with some embodiments.

Subsequently, the graphene layer 135 is formed over the lower bit line layer 133, as shown in FIG. 14 in accordance with some embodiments. The respective step is illustrated as the step S35 in the method 30 shown in FIG. 3. In some embodiments, the first ILD layer 127 is covered by the graphene layer 135. Some materials and processes used to form the graphene layer 135 are similar to, or the same as those used to form the graphene layer 113, and details thereof are not repeated herein.

Figure 15:
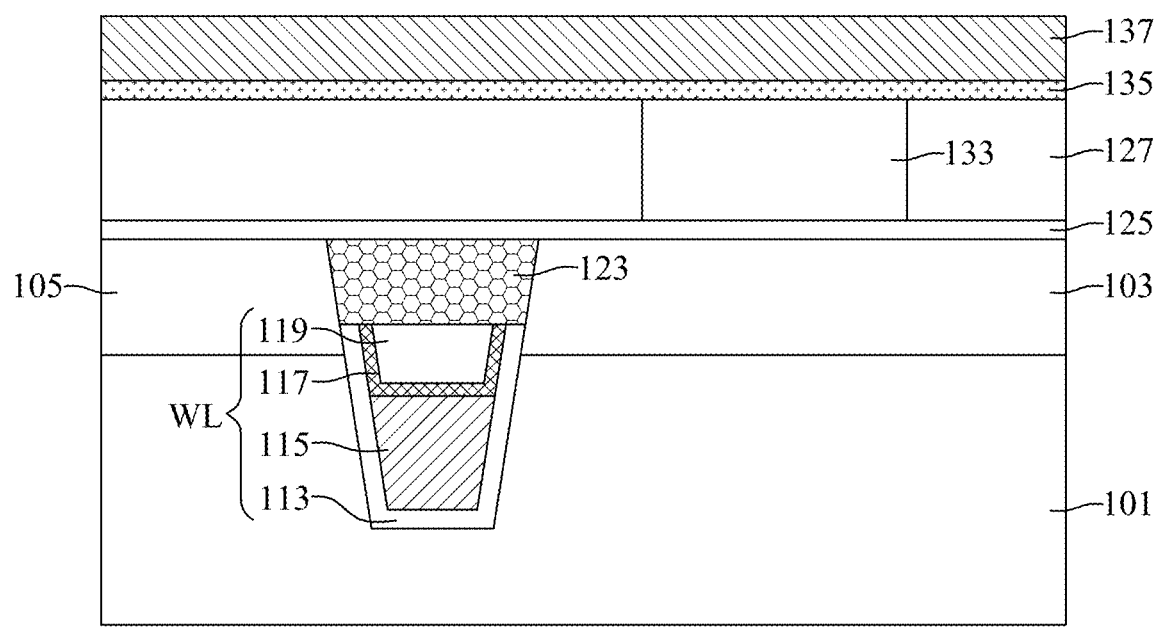
FIG. 15 is a cross-sectional view illustrating an intermediate stage of forming an upper bit line layer over the graphene layer during the formation of the semiconductor device, in accordance with some embodiments.

Next, the upper bit line layer 137 is formed over the graphene layer 135, as shown in FIG. 15 in accordance with some embodiments. The respective step is illustrated as the step S37 in the method 30 shown in FIG. 3. In some embodiments, the upper bit line layer 137 is made of a conductive material, such as tungsten (W), aluminum (Al), copper (Cu), titanium (Ti), tantalum (Ta), or another applicable conductive material.

In some embodiments, the upper bit line layer 137 may further include a barrier layer (not shown) formed over the graphene layer 135. In some embodiments, the barrier layer may include Ti, TiN, Ta, TaN, or another applicable barrier layer material. Moreover, the upper bit line layer 137 may be formed by one or more deposition processes. The deposition processes may include a CVD process, a PVD process, an ALD process, a PECVD process, an MOCVD process, a plating process, a sputtering process or another applicable process.

Figure 16:
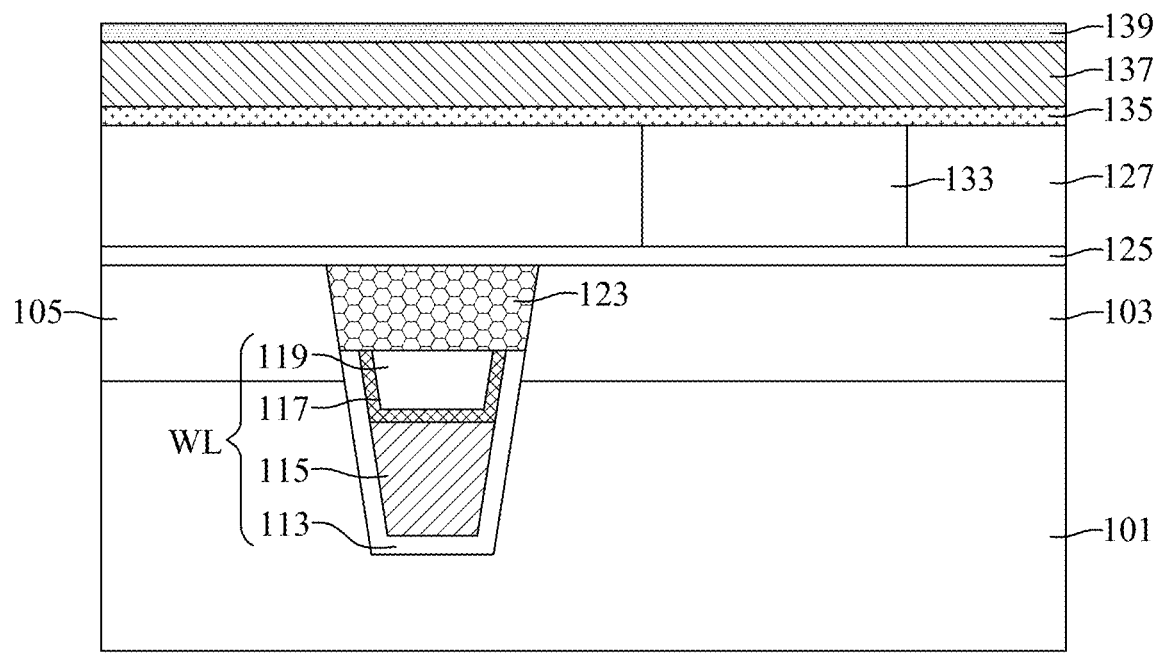
FIG. 16 is a cross-sectional view illustrating an intermediate stage of forming a graphene layer over the upper bit line layer during the formation of the semiconductor device, in accordance with some embodiments.

Then, the graphene layer 139 is formed over the upper bit line layer 137, as shown in FIG. 16 in accordance with some embodiments. The respective step is illustrated as the step S39 in the method 30 shown in FIG. 3. Some materials and processes used to form the graphene layer 139 are similar to, or the same as those used to form the graphene layer 113, and details thereof are not repeated herein.

Figure 17:
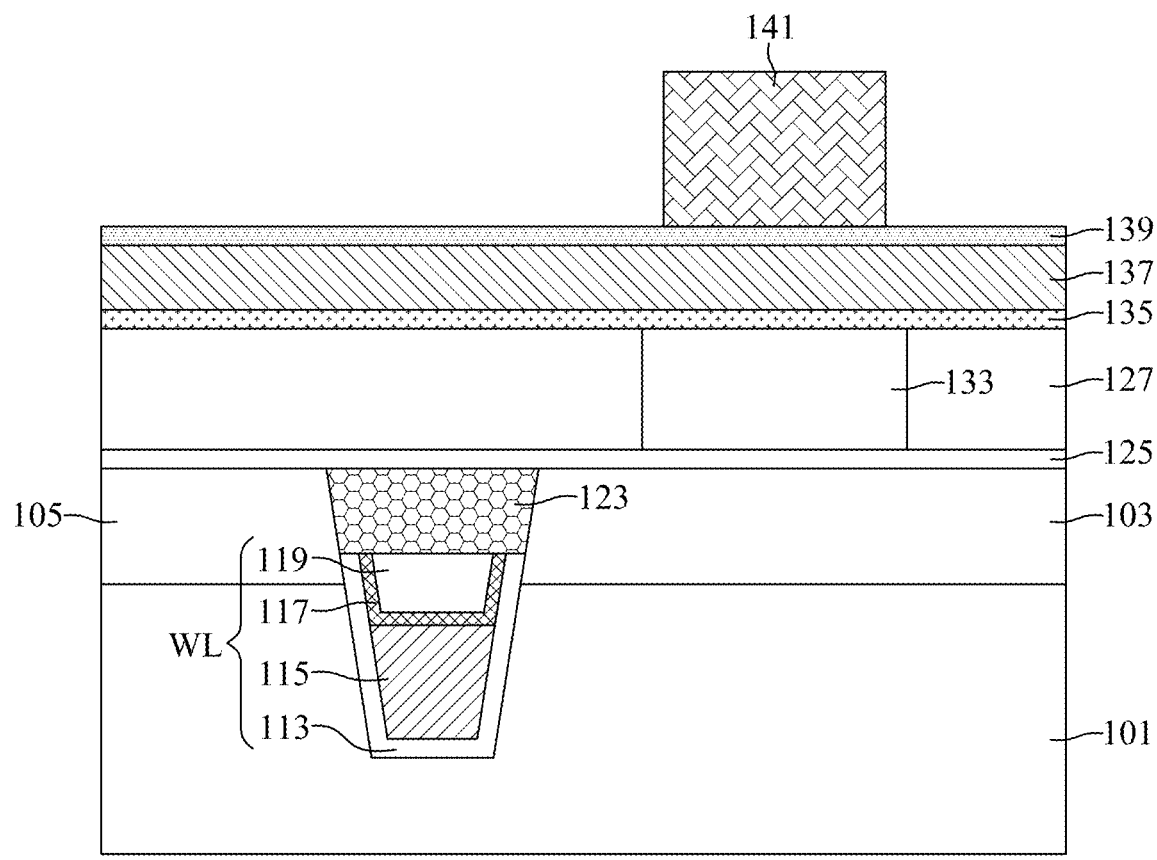
FIG. 17 is a cross-sectional view illustrating an intermediate stage of forming a dielectric cap layer over the graphene layer during the formation of the semiconductor device, in accordance with some embodiments.

After the graphene layer 139 is formed, a dielectric cap layer 141 is formed over the graphene layer 139, as shown in FIG. 17 in accordance with some embodiments. The respective step is illustrated as the step S41 in the method 30 shown in FIG. 3. It should be noted that the dielectric cap layer 141 overlaps the lower bit line layer 133. In some embodiments, the dielectric cap layer 141 is made of a dielectric material such as silicon nitride, although any other dielectric materials may alternatively be utilized.

Moreover, the formation of the dielectric cap layer 141 may include forming a dielectric cap material (not shown) over the graphene layer 139, and forming a pattern mask (not shown) over the dielectric cap material. Then, the dielectric cap material is etched by using the patterned mask as a mask to form the dielectric cap layer 141. After the dielectric cap layer 141 is formed, the pattered mask may be removed.

Figure 18:
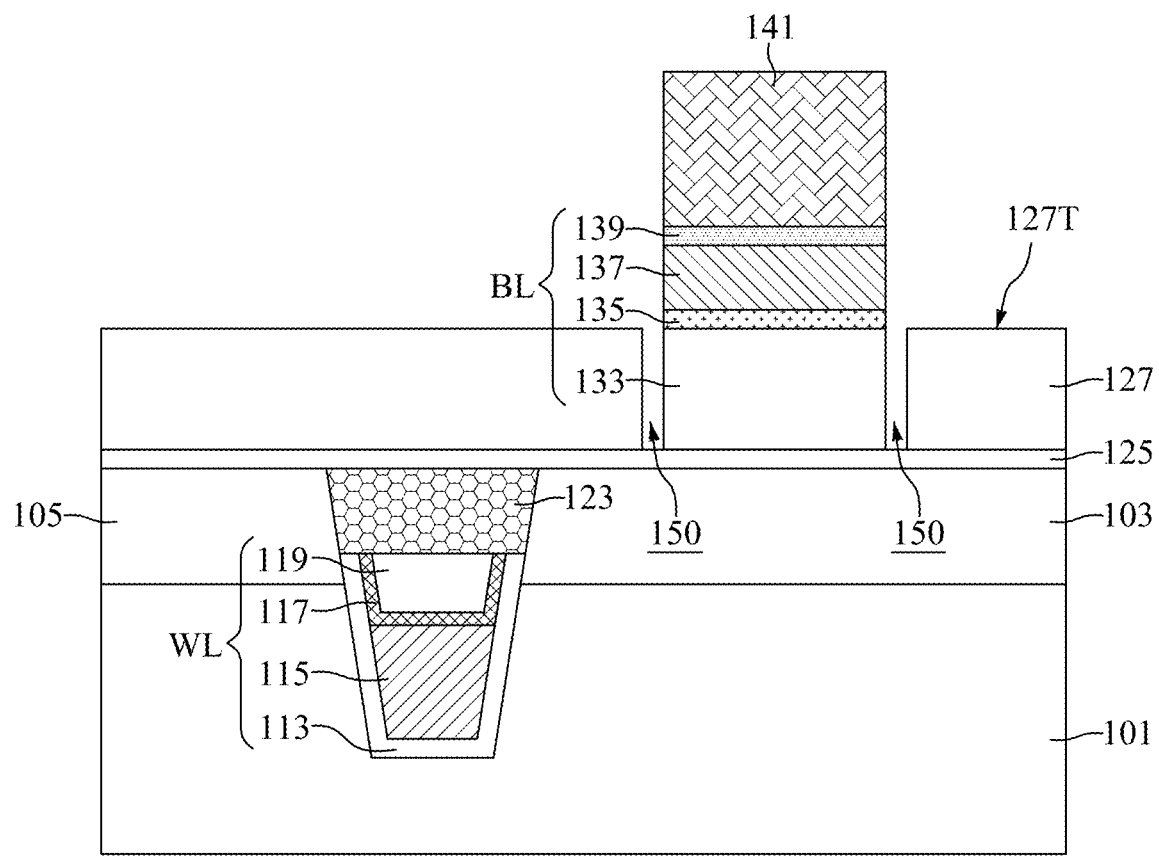
FIG. 18 is a cross-sectional view illustrating an intermediate stage of etching the graphene layers, the upper bit line layer and the lower bit line layer to form a bit line structure during the formation of the semiconductor device, in accordance with some embodiments.

Next, the graphene layers 139, 135, the upper bit line layer 137 and the lower bit line layer 133 are etched by using the dielectric cap layer 141 as a mask, as shown in FIG. 18 in accordance with some embodiments. The respective step is illustrated as the step S43 in the method 30 shown in FIG. 3. In some embodiments, the etching process includes a wet etching process, a dry etching process, or a combination thereof.

In some embodiments, the top surface 127T of the first ILD layer 127 is exposed after the etching process is performed, and the bit line structure BL is obtained. In some embodiments, gaps 150 are formed between the lower bit line layer 133 of the bit line structure BL and the first ILD layer 127. As described previously, since the materials of the dielectric layer 125 and the first ILD layer 127 are selected such that the etching selectivity of the first ILD layer 127 with respect to the dielectric layer 125 is high, the first ILD layer 127 is etched while the dielectric layer 125 may be substantially left. Thus, the dielectric layer 125 is partially exposed by the gaps 150. Moreover, since the graphene layers 139, 135, the upper bit line layer 137 and the lower bit line layer 133 are etched by using the dielectric cap layer 141 as a mask, the graphene layers 139, 135, the upper bit line layer 137, the lower bit line layer 133 and the dielectric cap layer 141 have aligned sidewalls.

Figure 19:
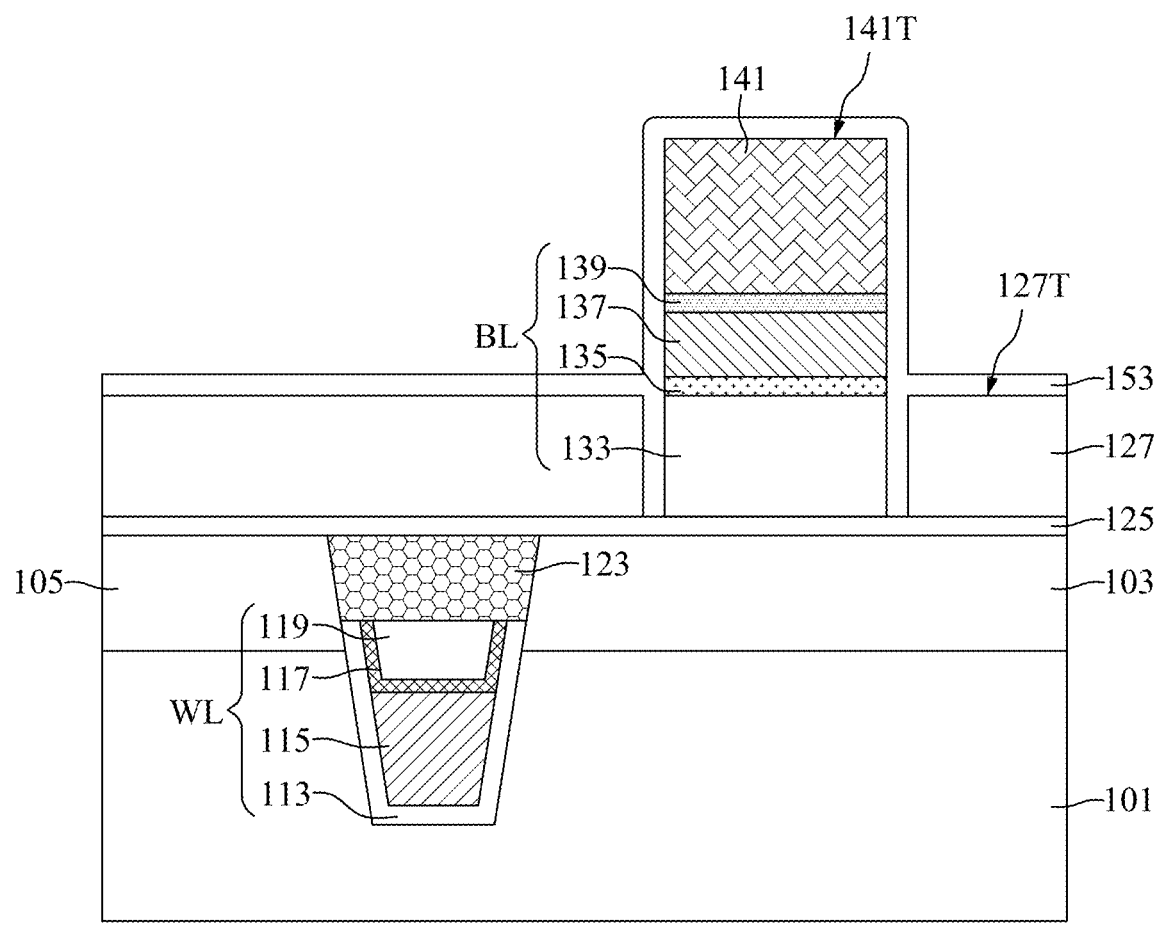
FIG. 19 is a cross-sectional view illustrating an intermediate stage of forming a dielectric spacer material during the formation of the semiconductor device, in accordance with some embodiments.

After the bit line structure BL is obtained, a dielectric spacer material 153 is formed over the top surface 141T and sidewalls of the dielectric cap layer 141 and on sidewalls of the bit line structure BL, as shown in FIG. 19 in accordance with some embodiments. In some embodiments, the gaps 150 are filled with the dielectric spacer material 153, and the top surface of the first ILD layer 127 is covered by the dielectric spacer material 153. In some embodiments, the dielectric spacer material 153 is made of a dielectric material such as silicon nitride, although any other dielectric materials may alternatively be utilized. Moreover, the dielectric spacer material 153 may be formed by a deposition process, such as a CVD process, a PVD process, an ALD process, a spin-on coating process or another applicable process.

Figure 20:
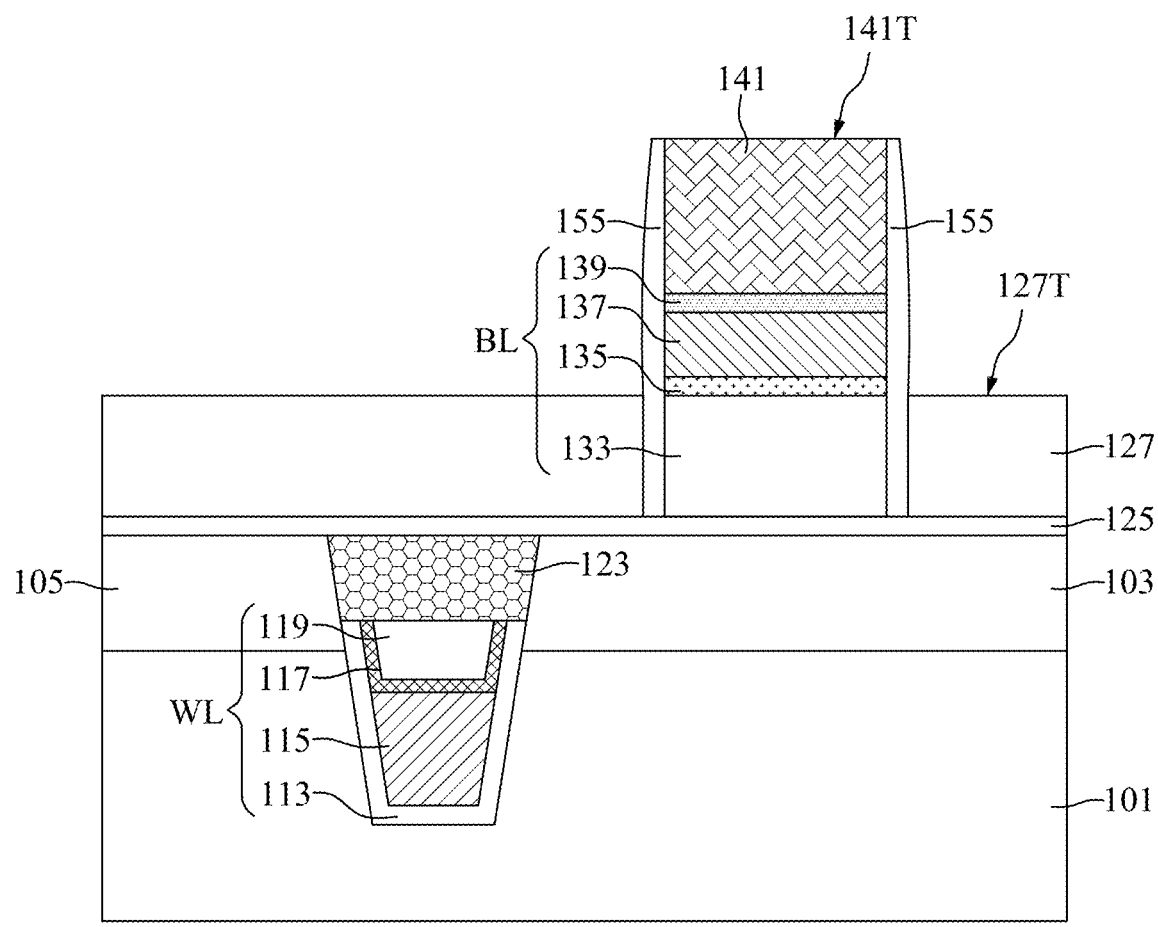
FIG. 20 is a cross-sectional view illustrating an intermediate stage of etching the dielectric spacer material to form dielectric spacers on sidewalls of the bit line structure during the formation of the semiconductor device, in accordance with some embodiments.

Then, an etch-back process is performed on the dielectric spacer material 153 until the top surface 141T of the dielectric cap layer 141 and the top surface 127T of the first ILD layer 127 are exposed, such that the dielectric spacers 155 are formed on sidewalls of the bit line structure BL and the dielectric cap layer 141, as shown in FIG. 20 in accordance with some embodiments. The respective step is illustrated as the step S45 in the method 30 shown in FIG. 3. In some embodiments, the etch-back process includes a wet etching process, a dry etching process, or a combination thereof.

After the dielectric spacers 155 are formed, the second ILD layer 157 is formed to surround the upper portions of the dielectric spacers 155, the bit line structure BL and the dielectric cap layer 131, as shown in FIG. 1 in accordance with some embodiments. Some materials and processes used to form the second ILD layer 157 are similar to, or the same as those used to form the first ILD layer 127, and details thereof are not repeated herein. After the second ILD layer 157 is formed, the semiconductor device 100 is obtained.

Embodiments of the semiconductor device 100 are provided in the disclosure. In the word line structure WL of the semiconductor device 100, the graphene layer 117 is disposed between the lower electrode layer 115 and the upper electrode layer 119 to lower the resistance of the word line structure WL. In the bit line structure BL of the semiconductor device 100, the graphene layer 135 is disposed between the lower bit line layer 133 and the upper bit line layer 137, and the graphene layer 139 is disposed over the upper bit line layer 137 to lower the resistance of the bit line structure. Since graphene is a low-resistance conductive material, resistive-capacitive (RC) delay of signals transmitted through the conductive layers (e.g., the lower electrode layer 113 and the upper electrode layer 119, and the lower bit line layer 133 and the upper bit line layer 137) can be reduced. Therefore, the operation speed of the semiconductor device 100 may be increased, which significantly improves the overall device performance.

In one embodiment of the present disclosure, a semiconductor device is provided. The semiconductor device includes a first source/drain region and a second source/drain region disposed in a semiconductor substrate. The semiconductor device also includes a word line structure disposed in the semiconductor substrate and between the first source/drain region and the second source/drain region. The word line structure includes a gate dielectric layer, and a lower electrode layer disposed over the gate dielectric layer. The word line structure also includes an upper electrode layer disposed over the lower electrode layer, and a first graphene layer disposed between the lower electrode layer and the upper electrode layer.

In another embodiment of the present disclosure, a semiconductor device is provided. The semiconductor device includes a dielectric layer disposed over a semiconductor substrate, and a bit line structure disposed over the dielectric layer. The bit line structure includes a lower bit line layer, and an upper bit line layer disposed over the lower bit line layer. The lower bit line layer and the upper bit line layer are made of different materials. The bit line structure also includes a first graphene layer disposed between the lower bit line layer and the upper bit line layer.

In yet another embodiment of the present disclosure, a semiconductor device is provided. The semiconductor device includes a word line structure disposed in a semiconductor substrate, a first source/drain region and a second source/drain region disposed in the semiconductor substrate and at opposite sides of the word line structure, and a bit line structure disposed over the first source/drain region. The word line structure includes a gate dielectric layer, and a lower electrode layer disposed over the gate dielectric layer. The word line structure also includes an upper electrode layer disposed over the lower electrode layer. The lower electrode layer and the upper electrode layer are made of different materials. The word line structure further includes a first graphene layer disposed between the lower electrode layer and the upper electrode layer and surrounding the upper electrode layer. The bit line structure includes a lower bit line layer, and a second graphene layer disposed over the lower bit line layer. The bit line structure also includes an upper bit line layer disposed over the second graphene layer. The lower bit line layer and the upper bit line layer are made of different materials. The bit line structure further includes a third graphene layer disposed over the upper bit line layer.

The embodiments of the present disclosure have some advantageous features. By forming a graphene layer in a word line structure or a bit line structure, the resistance may be decreased. As a result, the operation speed of the semiconductor device is increased, which significantly improves the overall device performance.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
   a first source/drain region and a second source/drain region disposed in a semiconductor substrate; and
   a word line structure disposed in the semiconductor substrate and between the first source/drain region and the second source/drain region, wherein the word line structure comprises:
   a gate dielectric layer;
   a lower electrode layer disposed over the gate dielectric layer;
   an upper electrode layer disposed over the lower electrode layer; and
   a first graphene layer disposed between the lower electrode layer and the upper electrode layer; and
   a dielectric cap layer disposed over the word line structure, wherein the dielectric cap layer is in direct contact with the first graphene layer of the word line structure.

2. The semiconductor device of claim 1, wherein the lower electrode layer is made of tungsten, titanium nitride, or a combination thereof, and the upper electrode layer is made of polysilicon.

3. The semiconductor device of claim 1, wherein the gate dielectric layer extends on sidewalls of the lower electrode layer and sidewalls of the upper electrode layer.

4. The semiconductor device of claim 3, wherein the sidewalls of the upper electrode layer are separated from the gate dielectric layer by the first graphene layer.

5. The semiconductor device of claim 1, further comprising:
   a dielectric layer disposed over the semiconductor substrate and the word line structure; and
   a bit line structure disposed over the dielectric layer and the first source/drain region.

6. The semiconductor device of claim 5, wherein the bit line structure comprises:
   a lower bit line layer disposed over the dielectric layer; and
   a second graphene layer disposed over the lower bit line layer.

7. The semiconductor device of claim 3, wherein the bit line structure further comprises:
   an upper bit line layer disposed over the second graphene layer; and
   a third graphene layer disposed over the upper bit line layer.

8. A semiconductor device, comprising:
   a dielectric layer disposed over a semiconductor substrate; and
   a bit line structure disposed over the dielectric layer, wherein the bit line structure comprises:
   a lower bit line layer;
   an upper bit line layer disposed over the lower bit line layer, wherein the lower bit line layer and the upper bit line layer are made of different materials;
   a first graphene layer disposed between the lower bit line layer and the upper bit line layer; and
   a dielectric spacer disposed on a sidewall of the bit line structure, wherein the dielectric spacer is in direct contact with the first graphene layer.

9. The semiconductor device of claim 8, wherein the lower bit line layer is made of polysilicon, and the upper bit line layer is made of tungsten, titanium nitride, or a combination thereof.

10. The semiconductor device of claim 8, further comprising:
    a dielectric cap layer disposed over the bit line structure.

11. The semiconductor device of claim 10, wherein the bit line structure further comprises:
    a second graphene layer disposed between the upper bit line layer and the dielectric cap layer.

12. The semiconductor device of claim 8, further comprising:
    a first source/drain region and a second source/drain region disposed in the semiconductor substrate, wherein the bit line structure overlaps the first source/drain region; and
    a word line structure disposed in the semiconductor substrate and between the first source/drain region and the second source/drain region, wherein the word line structure comprises a third graphene layer.

13. The semiconductor device of claim 12, wherein the word line structure further comprises:
    a lower electrode layer; and
    an upper electrode layer disposed over the lower electrode layer, wherein the lower electrode layer and the upper electrode layer are made of different materials, and the third graphene layer is disposed between the lower electrode layer and the upper electrode layer.

14. A semiconductor device, comprising:
    a word line structure disposed in a semiconductor substrate, wherein the word line structure comprises:
    a gate dielectric layer;
    a lower electrode layer disposed over the gate dielectric layer;
    an upper electrode layer disposed over the lower electrode layer, wherein the lower electrode layer and the upper electrode layer are made of different materials; and
    a first graphene layer disposed between the lower electrode layer and the upper electrode layer and surrounding the upper electrode layer;
    a first source/drain region and a second source/drain region disposed in the semiconductor substrate and at opposite sides of the word line structure; and
    a bit line structure disposed over the first source/drain region, wherein the bit line structure comprises:
    a lower bit line layer;
    a second graphene layer disposed over the lower bit line layer;
    an upper bit line layer disposed over the second graphene layer, wherein the lower bit line layer and the upper bit line layer are made of different materials; and
    a third graphene layer disposed over the upper bit line layer.

15. The semiconductor device of claim 14, further comprising:
    a second dielectric cap layer disposed over the bit line structure, wherein the second dielectric cap layer is in direct contact with the third graphene layer; and
    a dielectric spacer adjoins the lower bit line layer, the second graphene layer, the upper bit line layer, the third graphene layer, and the second dielectric cap layer.

16. The semiconductor device of claim 14, wherein a material of the lower electrode layer of the word line structure is the same as a material of the upper bit line layer of the bit line structure, and a material of the upper electrode layer of the word line structure is the same as a material of the lower bit line layer of the bit line structure.

17. The semiconductor device of claim 14, further comprising:
    a first dielectric cap layer disposed in the semiconductor substrate and covering the word line structure, wherein the upper electrode layer of the word line structure is enclosed by the first dielectric cap layer and the first graphene layer.

18. The semiconductor device of claim 17, further comprising:
a dielectric layer disposed between the bit line structure and the semiconductor substrate, wherein the first source/drain region, the second source/drain region and the first dielectric cap layer are covered by the dielectric layer.

* * * * *